(12) United States Patent
Yang et al.

(10) Patent No.: US 9,236,142 B2
(45) Date of Patent: Jan. 12, 2016

(54) SYSTEM METHOD AND APPARATUS FOR SCREENING A MEMORY SYSTEM

(71) Applicant: SanDisk Technologies Inc., Plano, TX (US)

(72) Inventors: Niles Yang, Mountain View, CA (US); Jianmin Huang, Milpitas, CA (US); Bhuvan Khurana, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 72 days.

(21) Appl. No.: 14/275,075

(22) Filed: May 12, 2014

(65) Prior Publication Data
US 2015/0318055 A1 Nov. 5, 2015

Related U.S. Application Data

(60) Provisional application No. 61/986,533, filed on Apr. 30, 2014.

(51) Int. Cl.
G11C 29/00 (2006.01)
G11C 7/10 (2006.01)
(52) U.S. Cl.
CPC . G11C 29/00 (2013.01); G11C 7/10 (2013.01)
(58) Field of Classification Search
CPC ................. G11C 29/44; G11C 29/72

USPC .......................................... 714/720
See application file for complete search history.

(56) References Cited

U.S. PATENT DOCUMENTS

| 5,377,152 A * | 12/1994 | Kushiyama | G11C 29/02 365/149 |
| 5,682,389 A * | 10/1997 | Nizaka | G11C 29/02 714/718 |
| 5,859,804 A * | 1/1999 | Hedberg | G11C 29/72 365/200 |
| 2006/0215297 A1* | 9/2006 | Kikuchi | G06F 11/1076 360/51 |
| 2012/0020164 A1* | 1/2012 | Huang | G11C 29/10 365/185.18 |

* cited by examiner

Primary Examiner — David Ton
(74) Attorney, Agent, or Firm — Martine Penilla Group, LLP

(57) ABSTRACT

A system and method of writing data to a memory block includes receiving user data in a memory controller, the user data to be written to the memory block. The user data is first written to a buffer in the memory controller. A screening pattern is written to at least one screening column in the memory block and a first memory integrity test is performed. The first memory integrity test includes reading screening column data from the at least one screening column and comparing the screening column data read from the at least one screening column to the screening pattern. The user data is written to at least one user data column in the memory block when the screening column data read from the at least one screening column matches the screening pattern in the first memory integrity test.

20 Claims, 7 Drawing Sheets

SYSTEM METHOD AND APPARATUS FOR SCREENING A MEMORY SYSTEM

CROSS REFERENCE TO RELATED APPLICATIONS

This application claims priority from U.S. Provisional Patent Application No. 61/986,533 filed on Apr. 30, 2014 and entitled "System Method and Apparatus for Screening a Memory System," which is incorporated herein by reference in its entirety.

BACKGROUND

The present invention relates generally to memory systems, and more particularly, to methods and systems for using and testing the integrity of memory systems.

Solid state memory systems are manufactured in great volume and in many different forms including volatile type memory circuits and non-volatile type memory circuits. As part of the production process the completed memory circuits are tested to confirm the proper operation of the memory. Specifically, the completed memory circuits are tested to confirm the memory circuit can be written to and the data that was written (i.e., stored) in the memory circuit can accurately be read back from the memory circuit. Typically, a high voltage write and erase cycles and read operations are applied to the memory circuit. The higher voltage of the operations physically stress the semiconductor devices (e.g., gates, P-N junctions, conductive lines, etc.) greater than typical operating voltage so as to cause physically weaker semiconductor devices to fail.

There are many types of tests performed as part of the manufacturing process. These manufacturing process tests can reliably only identify memory circuits that fail due to manufacturing defects or fail during early operations, often referred to as infant mortality, occurring in an early portion of the projected service life of the memory circuit.

The memory circuits that pass the manufacturing process tests are then shipped to end users and distributors. Unfortunately, many memory circuits can fail later in the projected service life, well after the memory circuits successfully passed the manufacturing process tests. When memory circuits fail, the data stored therein can be lost, corrupted or otherwise rendered not accessible and effectively lost.

In view of the foregoing, there is a need for system and method for verifying the operational status of the memory during the projected service life of the memory in such a manner to prevent loss of the data stored therein.

SUMMARY

Broadly speaking, the present invention fills these needs by providing a memory system including a verification process for verifying the operational status of the memory circuits included in the memory system, before storing user data in the memory circuits. It should be appreciated that the present invention can be implemented in numerous ways, including as a process, an apparatus, a system, computer readable media, or a device. Several inventive embodiments of the present invention are described below.

One embodiment provides a method of writing data to a memory block including receiving user data in a memory controller, the user data to be written to the memory block. The user data is first written to a buffer in the memory controller. A screening pattern is written to at least one screening column in the memory block and a first memory integrity test is performed. The first memory integrity test includes reading screening column data from the at least one screening column and comparing the screening column data read from the at least one screening column to the screening pattern. The user data is written to at least one user data column in the memory block when the screening column data read from the at least one screening column matches the screening pattern in the first memory integrity test.

The method can also include performing a second memory integrity test including reading the screening column data from the at least one screening column and comparing the screening column data read from the at least one screening column to the screening pattern. A user data integrity test is performed when the screening column data read from the at least one screening column matches the screening pattern in the second memory integrity test. A confirmation of writing the user data in the memory block is also output after the successful user data integrity test.

The user data integrity test can include reading user column data from the at least one user data column and comparing the user column data read from the at least one user data column to the user data in the buffer in the memory controller and outputting the confirmation of writing the user data in the memory block includes releasing the user data in the buffer in the memory controller.

The at least one screening column can include at least one bitline in the memory block. The at least one screening column can span a selected portion of the wordlines in the memory block. Alternatively, the at least one screening column can span all of the wordlines in the memory block.

The at least one screening column can include at least one wordline in the memory block. The at least one screening column can span a selected portion of the bitlines in the memory block.

Writing the screening pattern to the at least one screening column in the memory block can include determining if at least one of the first memory integrity test, the second memory integrity test and/or the user data integrity test is applicable to the memory block.

Another embodiment provides a method of writing data to a memory block including receiving user data in a memory controller, the user data to be written to the memory block, writing the user data to a buffer in the memory controller, writing a screening pattern to at least one screening column in the memory block, performing a first memory integrity test, writing user data to at least one user data column in the memory block when the screening column data read from the at least one screening column matches the screening pattern in the first memory integrity test, performing a second memory integrity test, performing a user data integrity test when the screening column data read from the at least one screening column matches the screening pattern in the second memory integrity test. A confirmation of writing the user data in the memory block is output if the user data integrity test is successful and the user data is released from the buffer in the memory controller.

Yet another embodiment provides a memory system including at least one memory block, a memory controller coupled to the at least one memory block, a screening pattern capable of being written to the at least one memory block and a memory verification logic. The memory verification logic includes logic for performing a first memory integrity test and logic for writing user data to at least one user data column in the memory block when a screening column data read from at least one screening column in the memory block matches the screening pattern in the first memory integrity test.

The memory verification logic can also include logic for performing a second memory integrity test, logic for performing a user data integrity test when the screening column data read from the at least one screening column matches the screening pattern in the second memory integrity test, logic for outputting a confirmation of writing the user data in the memory block and logic for releasing the user data from the buffer in the memory controller.

At least one of the memory verification logic and/or the screening pattern can be included in the memory controller. Alternatively, at least one of the memory verification logic and/or the screening pattern can be included in a logic control circuit in a memory integrated circuit including at least one of the at least one memory block.

The at least one memory block includes at least one screening column and at least one user data column. The at least one screening column can include a width of between about 1 bit and about 128 bits. The at least one screening column can include at least two non-contiguous screening columns. The at least one screening column can include at least one bitline.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Several exemplary embodiments for memory systems including a verification process for verifying the operational status of the memory circuits included in the memory system, before storing user data in the memory circuits, will now be described. It will be apparent to those skilled in the art that the present invention may be practiced without some or all of the specific details set forth herein.

A memory verification process can be added to the write operations for that memory circuit. The memory verification process can be initiated by a memory controller requesting user data be written to the memory circuit. The memory verification process includes performing a first memory integrity test, before writing user data to the memory circuit. If the memory circuit is verified as being operational in the first integrity test, then the user data is written to the memory circuit. Next, a second memory integrity test is performed, after writing user data to the memory circuit. If the memory circuit is verified as being operational in the second integrity test, then the stored user data is tested to make sure the user data was stored accurately. If the user data was stored in the memory circuit accurately, then the memory controller is notified that the user data was successfully written to the memory circuit.

Past approaches to prevent data loss due to memory circuit failures have included using duplex memory blocks where the user data is duplicated and stored in two separate blocks of memory. The duplex memory approach increases costs due to requiring twice the quantity of memory cells. By way of example, for each 1 megabyte memory block a separate 1 megabyte memory block would be required. Another approach as been to use a logical redundancy such as XOR logic. The extra space for the memory redundancy also consumes the memory capacity and still does not provide long term protection of the user data once the short term redundant data is removed from the memory system.

Figure 1:
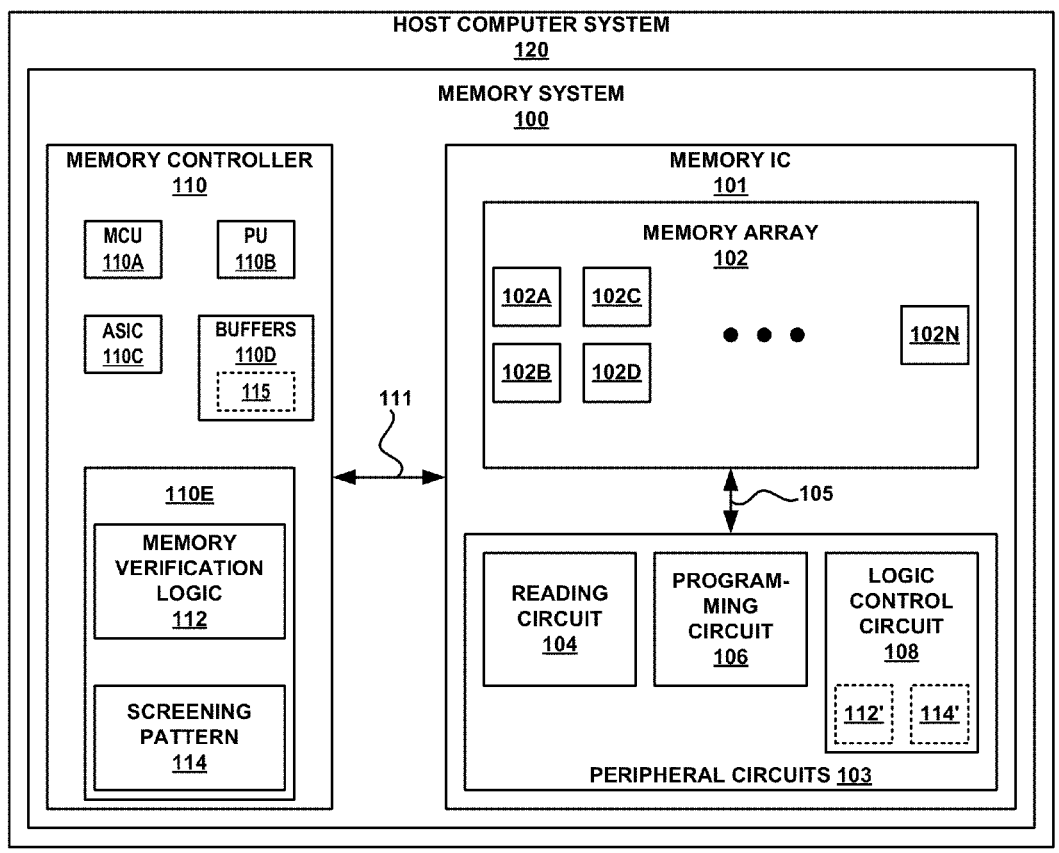
FIG. 1 is a block diagram of a memory system, for implementing embodiments of the present disclosure.

FIG. 1 is a block diagram of a memory system 100, for implementing embodiments of the present disclosure. The memory system 100 is coupled to or included as part of a host computer system 120. The memory system 100 includes one or more memory integrated circuits 101. The memory integrated circuits 101 include a memory array 102. The memory array 102 includes many memory cells arranged in logical blocks 102A-n of memory cells (e.g., memory blocks 102A-n).

The memory integrated circuits 101 can also include peripheral circuits 103 coupled to the memory array 102 buy a bus 105. The bus 105 is coupled to sets of wordlines and bitlines for each of the memory blocks 102A-n. The peripheral circuits can include reading circuits 104, programming circuits 106 and logic control circuits 108, for reading, writing and controlling the memory blocks 102A-n, respectively.

The memory system 100 also includes a memory controller 110. The memory controller 110 is coupled to one or more memory integrated circuits 101 by a bus 111. The memory controller 110 can include circuits for controlling the memory system 100 such as a memory control unit 110A, a processor 110B, an application specific integrated circuit (ASIC) 110C, random access memory buffers 110D and memory controller logic 110E.

The memory controller logic 110E includes interfacing protocols between the memory controller 110 and the memory blocks 102A-n and between the memory system 100 and the host computer system 120. The memory controller logic 110E can include software and firmware that is executable by the processor 110B. The memory controller logic 110E can include memory verification logic 112 and one or more memory screening patterns 114. Alternatively or additionally, the logic control circuits 108 can include memory verification logic 112' and one or more memory screening patterns 114'. The memory verification logic 112, 112' and one or more memory screening patterns 114, 114' can be used as described in more detail below.

The screening patterns 114, 114' can include any known suitable set of data or data values that can be programmed to a selected set of memory cells (i.e., screening columns) and can be accurately read back from the memory cells. In one implementation the screening patterns 114, 114' can include a previously selected value that can be repetitively programmed in the selected set of memory cells according to a selected repetition rule. By way of example, a hexadecimal value of 5A5A can be selected as a pattern to be programmed repeatedly and sequentially in the selected set of memory cells. Alternatively, multiple values can be selected as the pattern to be programmed in the selected set of memory cells. The foregoing example patterns are merely examples and are not an exhaustive or all inclusive list of possible screening patterns 114, 114'.

The memory blocks 102A-n can include nonvolatile memory (NVM) such as flash memory (e.g., NAND flash) and other types of memory such as NOR, ORNAND, 3D memory and charge trapping memory with material such as silicon nitride, and phase change memory such as ReRAM, and semi-volatile memory such as DRAM and SRAM. The memory blocks 102A-n can also include volatile type memory circuits. The volatile type memory circuits can include, as an example, dynamic random access memory (DRAM) and static random access (SRAM) memory circuits.

The reliability of the user data storage in the memory block can be improved using the principles disclosed below for any type of memory that includes a memory cell, an accessing wordline and an accessing bitline. While the following examples discuss using a wordlines, similar processes can be applied to bitlines instead of or in addition to the wordline processes.

Figure 2:
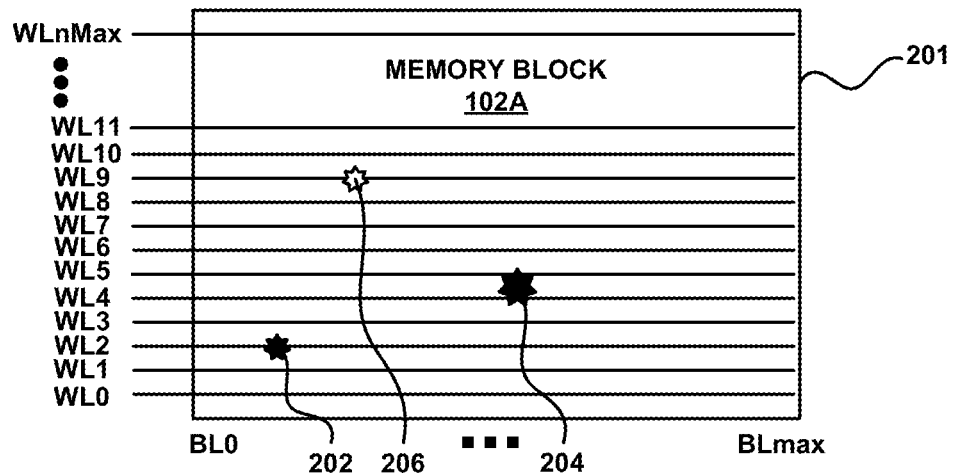
FIG. 2 is a simplified block diagram of a memory block, for implementing embodiments of the present disclosure.

FIG. 2 is a simplified block diagram of a memory block 102A, for implementing embodiments of the present disclosure. Each of the memory blocks 102A-n undergo write and erase cycles and read accesses. The memory blocks 102A-n can suffer device failures as the cycling/access counts increase. Typical failure modes in a memory block can include but are not limited to:

A wordline to wordline short;
Broken (open) wordlines;
A wordline to substrate short;
A slow to program memory cell(s);

A wordline to wordline short 204 is shown in FIG. 2. The wordline to wordline short 204 typically occurs due to an arc through an insulator electrically separating the wordlines WL4 and WL5 and thus allowing the two wordlines to have the same voltage during operations. This leads to writing the same data to the memory cells coupled to both wordlines WL4 and WL5.

A break or open 206 in wordline WL9 is shown in FIG. 2. The open 206 in wordline WL9 is typically caused by a failure in the conductor that forms wordline WL9 such as caused by heat, voltage or current stresses. The open 206 in the wordline WL9 prevents wordline WL9 from accessing the memory cells further to the right of the open 206.

A wordline to substrate 201 short 202 is shown in FIG. 2. The wordline to substrate 201 short 202 is typically caused by an arc an insulator electrically separating the wordline WL2 and the substrate 201. The wordline WL2 to substrate 201 short 202 shorts all the memory cells coupled to the wordline WL2 to the substrate voltage and prevents any data level placed on wordline WL2 from reaching any memory cells.

The slow to program fault occurs when the program time is beyond the specification time limit for the memory cell and the memory cell cannot pass the program verification status. The slow to program fault can be caused by memory cell degradation and a failed or defective memory cell.

Figure 3:
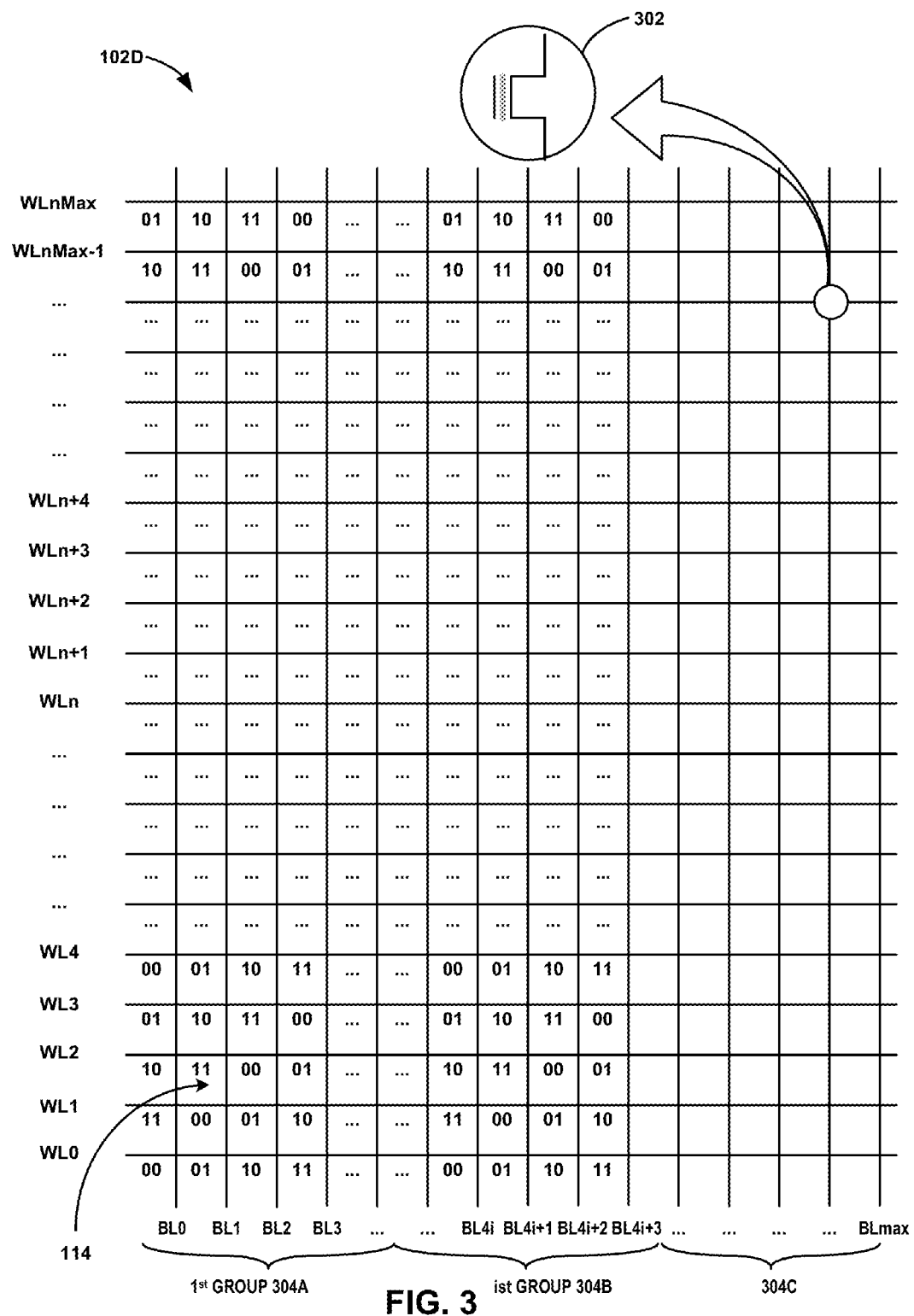
FIG. 3 is a simplified block diagram of a memory block, for implementing embodiments of the present disclosure.

FIG. 3 is a simplified block diagram of a memory block 102D, for implementing embodiments of the present disclosure. The memory block 102D includes multiple wordlines WL0-WLnMax and multiple bitlines BL0-BLmax in an array with a corresponding memory cell 302 located at the intersections of each of the wordlines and each of the bitlines.

The bitlines BL0-BLmax are divided into screening columns 304A, 304B and user data columns 304C. The screening columns 304A, 304B include a first group of bitlines and an ist group of bitlines, respectively. The first group of bitlines includes bitlines BL0-BL3 and the ist group of bitlines includes bitlines BL4i-BL4i+3. The screening columns 304A, 304B span selected ones of or a portion of the wordlines WL0-WLnMax and preferably span all of the wordlines WL0-WLnMax. As will be described in more detail below, the screening pattern 114 of data is written to the screening columns 304A, 304B.

The screening columns 304A, 304B include a subset of all the bitlines BL0-BLmax in the memory block 102D. The screening columns 304A, 304B can include as many bitlines as desired. Preferably, the screening columns 304A, 304B include between 1 and more than about 128 bitlines. By way of example, the screening columns 304A, 304B can include 1, 2, 4, 8, 12, 16, 32 or 64 bitlines.

In one implementation the screening columns 304A, 304B can be in a single contiguous block of screening columns as shown in FIG. 3 and as a single block can include as few as one bitline and as many as 128 or more bitlines. A maximum number of bitlines included in the screening columns 304A, 304B is limited only by the total number of all of the bitlines BL0-BLmax in the memory block 102D. However, one skilled in the art would understand using all of the bitlines BL0-BLmax in the memory block 102D as screening columns as described herein would not provide an efficient quantity of memory available for user data storage.

The user data columns 304C also span all of the wordlines WL0-WLnMax. The user data columns 304C include the bitlines not included in the screening columns 304A, 304B.

Figure 4:
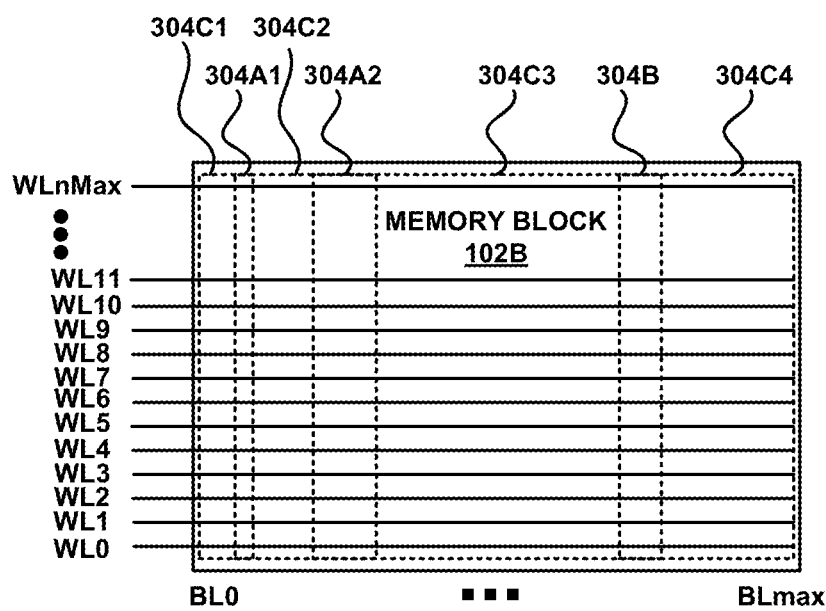
FIG. 4 is a simplified block diagram of a memory block with non-contiguous screening columns, for implementing embodiments of the present disclosure.

As shown in FIG. 3 above the screening columns 304A, 304B are substantially contiguous. However, the screening columns 304A, 304B are not required to be contiguous. FIG. 4 is a simplified block diagram of a memory block 102B with non-contiguous screening columns 304A1-2, 304B, for implementing embodiments of the present disclosure. The memory block 102B includes screening columns 304A, 304B where screening columns 304A includes non-contiguous screening columns 304A1-2. The memory block 102B also includes user data columns 304C including non-contiguous user data columns 304C1-4.

Each of the non-contiguous screening columns 304A1-2, 304B can include an equal number or a different number of bitlines. The non-contiguous screening columns 304A1-2, 304B can be evenly distributed or unevenly distributed across the bitlines BL0-BLmax. The location and selection of the screening columns within the selected memory block can be the same or different in each memory block, as determined by the memory verification logic 112, 112'.

Figure 5:
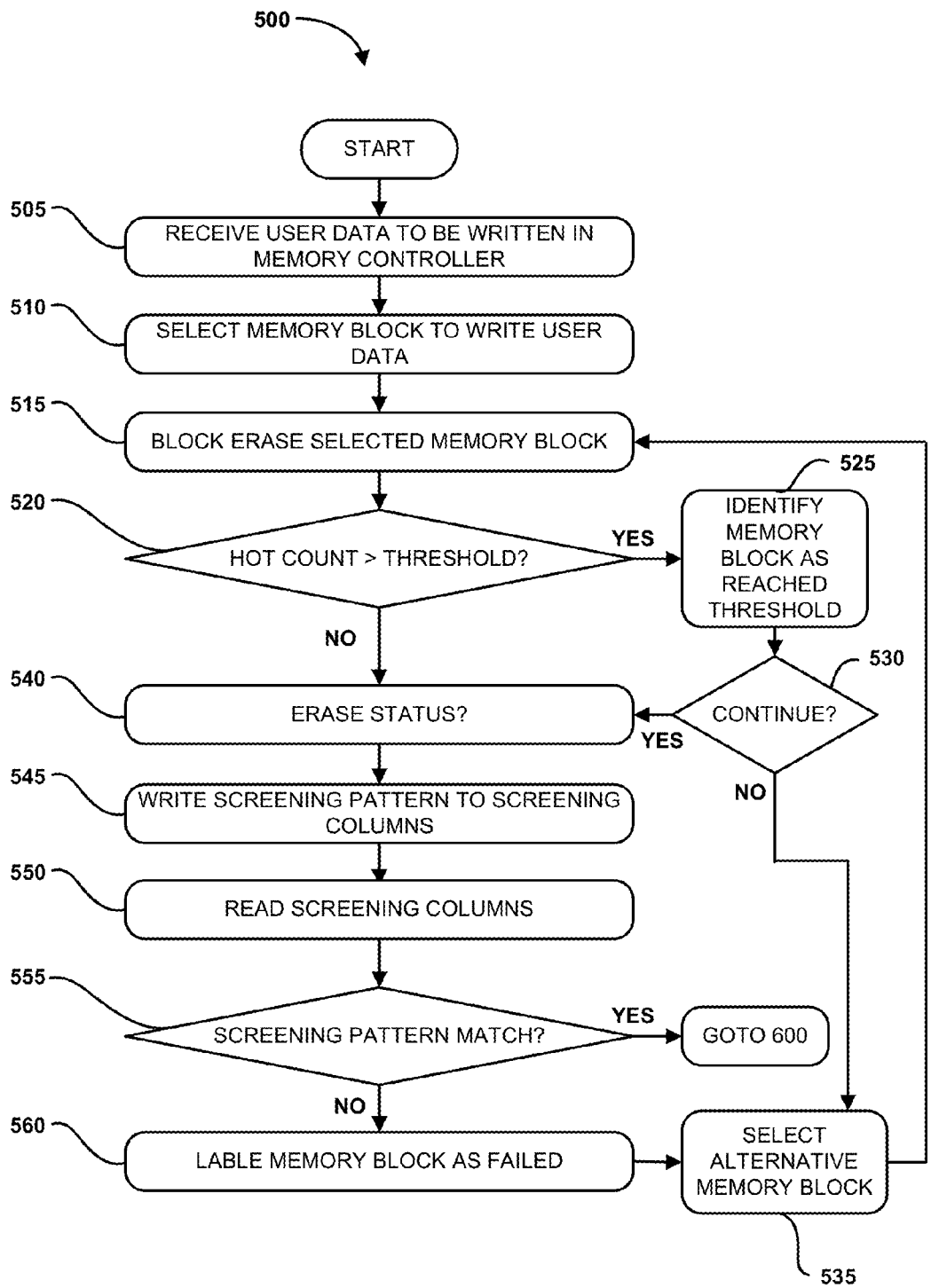
FIG. 5 is a flowchart diagram that illustrates the method operations performed in a first memory integrity test of a selected memory block, for implementing embodiments of the present disclosure.

FIG. 5 is a flowchart diagram that illustrates the method operations 500 performed in a first memory integrity test of a selected memory block, for implementing embodiments of the present disclosure. In an operation 505, user data 115 to be written to the memory system 100 is received in the memory controller 110. The memory controller 110 temporarily stores the received user data 115 in one or more buffers 110D.

In an operation 510, a memory block 102D is selected from the multiple memory blocks 102A-N in the memory array 102. A block erase function is performed on the selected memory block 102D, in an operation 515. The block erase serves at least two purposes. First, the operation of erasing the selected memory block 102D removes all data previously stored in the selected memory block 102D. Second, the operation of erasing the selected memory block 102D can also be a test of the selected memory block as the erase operation includes charging at least a portion of the wordlines WL0-WLnMax and bitlines BL0-BLmax to a corresponding erase voltage. The block erase function can optionally include using a higher voltage and/or current than typical write and read operations so as to additionally stress the memory circuits in the selected memory block 102D. By way of example, all cells in the selected memory block can be subjected to a high voltage biasing for erasure, from the p-type well with the wordlines grounded.

In an optional operation 520, the hot count for the selected memory block 102D is compared to a threshold count. The threshold count is a factory set number of write cycles in the projected service life of the selected memory block. If the hot count for the selected memory block 102D exceeds the threshold count then the method operations continue in an operation 525. If the hot count for the selected memory block 102D does not exceed the threshold count then the method operations continue in an operation 540.

In operation 525, the memory controller 110 is notified that the selected memory block 102D has exceeded the threshold count. The memory verification logic 112 can use the hot count information for the selected memory block to determine what actions to take in an operation 530. If the memory verification logic 112 includes a setting that the selected memory block is not to be used if the hot count exceeds the threshold, then the method operations continue in an operation 535. In operation 535, an alternative memory block (e.g., memory block 102B) is selected and the method operations begin at operation 515 as described above.

Alternatively, the memory verification logic 112 could initiate an alternative control scheme for the selected memory block. By way of example, the memory verification logic 112 could include a setting that indicates the memory verification process is only applied after the threshold count is exceeded and then the method operations could continue in an operation 540 as described below. In yet another alternative control scheme, the memory verification logic 112 could direct the method operations to continue in method operation 600, as described in more detail below, in response to the hot count information for the selected memory block. In still another alternative control scheme, the memory verification logic 112 could direct the method operations to continue in selected operations such as operation 605, 645, 650 as described in more detail below. By way of example, the memory verification logic 112 can perform only selected one or more of operations of 540-650 if the hot count information for the selected memory block fell within a selected range of hot counts. The memory verification logic 112 allows the selected memory block to be tested during times in the selected memory block's projected service life that failures are likely to occur.

By way of example, if desired the memory block can be tested during an early portion of the projected service life to prevent data losses due to infant mortality type failures. Further, in a portion of the service life after the infant mortality hot count, the less or even no memory verification of the selected memory block could be used so as to speed up the write cycle time. In another example, the memory verification logic 112 may bypass memory verification of the selected memory block until the threshold count is exceeded, thus increasing scrutiny toward an end of the projected service life of the selected memory block. If should be understood that any combination of portions of hot counts in the projected service life of the selected memory block could be selected for one or more memory verification as described in FIGS. 5 and 6.

In operation 540, the memory controller 110 is notified that the block erase has been completed. In an operation 545, a screening pattern 114 is written to the screening columns 304A, 304B, in the selected memory block. In an operation 550, the screening columns 304A, 304B are read and the data read from the screening columns is compared to the screening pattern 114 for the first memory integrity test, in an operation 555. Operation 550 can include a normal read or a fast read. A "normal" read is a read operation with normal NAND flash settings. A fast read includes setting shortened timing parameters for the NAND, in order to reduce the read time.

Operation 550 can a read operation including biasing the reading wordline, for example, from 0~5V, while the two immediate neighboring wordlines are biased at higher voltages, e.g., 7.5V, in order to conduct the current regardless of the present charge states of the neighboring wordlines.

Figure 6:
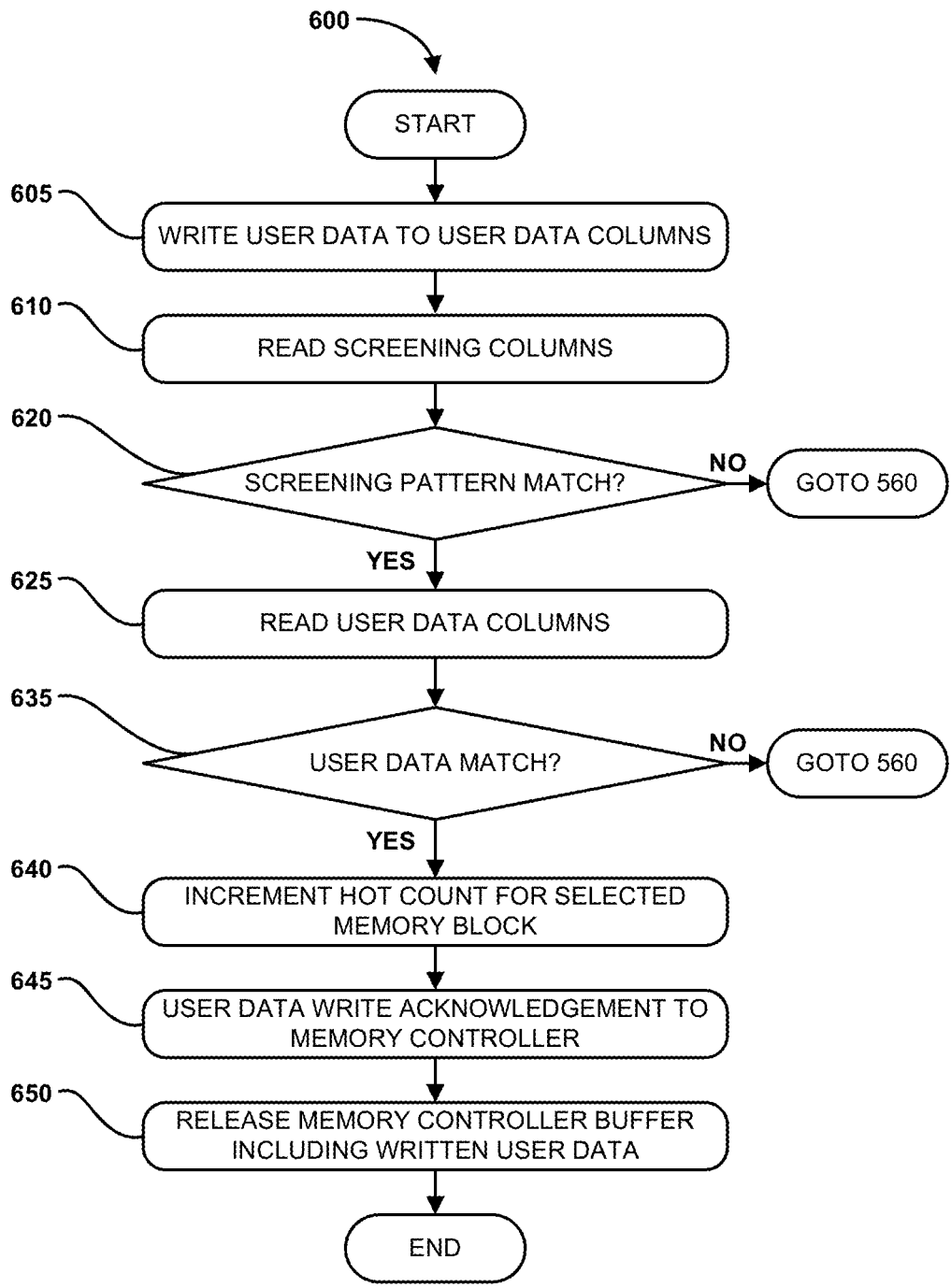
FIG. 6 is a flowchart diagram that illustrates the method operations performed in writing user data to a selected memory block that successfully passed the first memory integrity test, for implementing embodiments of the present disclosure.

The method operations continue in an operation 600, in FIG. 6, if the data read from the screening columns matches the screening pattern 114. The method operations continue in an operation 560, if the data read from the screening columns does not match the screening pattern 114.

In an operation 560, the memory controller 110 is notified that the selected memory block 102D failed the first memory integrity test and the method operations continue in operation 530, as described above. Operation 560 is described in more detail in FIG. 7 below.

FIG. 6 is a flowchart diagram that illustrates the method operations 600 performed in writing user data to a selected memory block that successfully passed the first memory integrity test, for implementing embodiments of the present disclosure. In an operation 605, the user data 115 from the buffer 110E in the memory controller 110 is written to the user data columns 304C of the selected memory block 102D.

In an operation 610, the screening columns 304A, 304B are read and the data read from the screening columns is compared to the screening pattern 114 for a second memory integrity test, in an operation 620. The method operations continue in an operation 625, if the data read from the screening columns 304A, 304B matches the screening pattern 114. The method operations continue in an operation 560 of FIG. 5, if the data read from the screening columns 304A, 304B does not match the screening pattern 114.

In an operation 625, the user data columns 304C are read and the data read from the user data columns is compared to the user data 115 in the buffer 110E in the memory controller 110, for a user data integrity test, in an operation 635. The method operations continue in an operation 640, if the data read from the user data columns 304C matches the user data 115 in the buffer 110E. The method operations continue in an operation 560 of FIG. 5, if the data read from the user data columns 304C does not match the user data 115 in the buffer 110E.

In an optional operation 640, the hot count of the selected memory block 102D is incremented. In an operation 645, a user data write acknowledgement is sent to the memory controller 110 because the user data 115 was successfully written to and read from the user data columns 304C. Upon receipt of the user data write acknowledgement, the memory controller releases the buffer 110E including the successfully written user data 115, in an operation 650, and the method operations can end.

When the selected memory block 102D fails one of the first memory integrity test (operation 555, in FIG. 5), the second memory integrity test (operation 620, in FIG. 6) or the user data integrity test (operation 635, in FIG. 6), the selected memory block has experienced a failure such as those described above, e.g., a wordline to wordline short, an open wordline, a wordline to substrate short or a slow to program memory cell. In some instances, such a failure in the selected memory block 102D could result in disabling the entire memory block as having failed and the memory controller 110 can exclude the failed memory block from the memory blocks 102A-N available for writing data to. However, often the cause for the failed first memory integrity test, the failed second memory integrity test or the failed user data integrity test is an isolated fault and much of the memory block is still usable.

Figure 7:
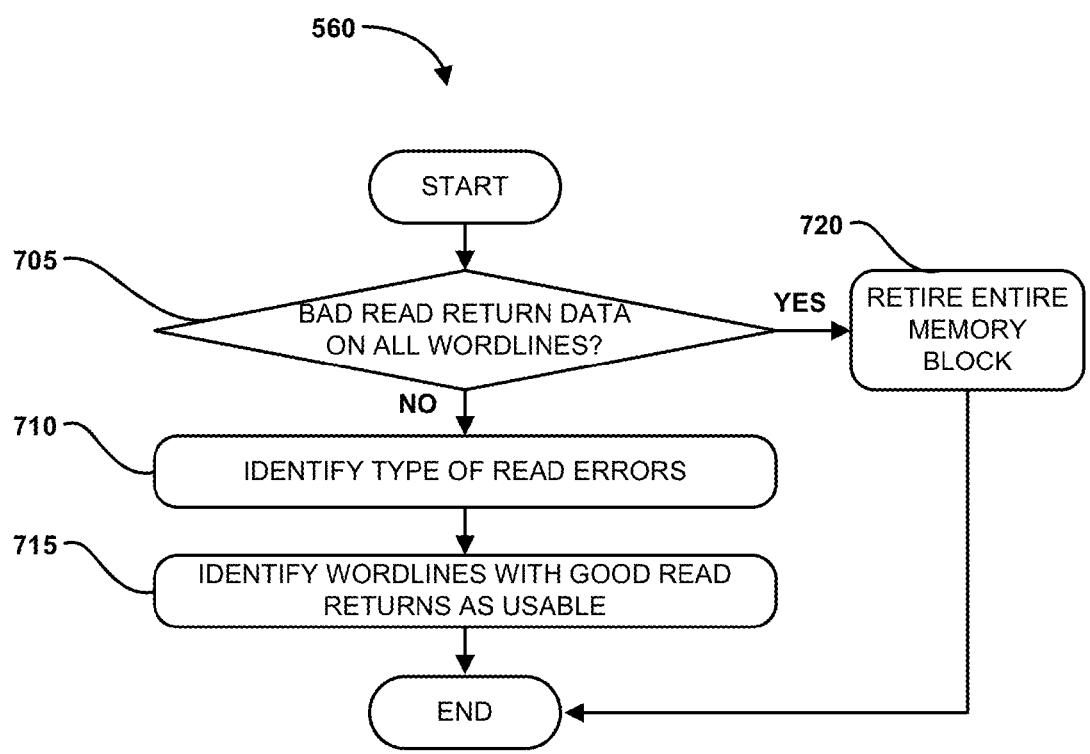
FIG. 7 is a flowchart diagram that illustrates the method operations performed when the selected memory block has failed at least one of the first memory integrity test, the second memory integrity test or the user data integrity test, for implementing embodiments of the present disclosure.

FIG. 7 is a flowchart diagram that illustrates the method operations 560 performed when the selected memory block 102D has failed at least one of the first memory integrity test, the second memory integrity test or the user data integrity test, for implementing embodiments of the present disclosure. In an operation 705, the data read in the failed test is compared to the corresponding source data, e.g., screening pattern 114 or user data 115. If the read data is in error on all wordlines WL0-WLnMax then the method operations continue in an operation 720. In operation 720, the entire memory block is retired, e.g., the memory controller 110 excludes the failed memory block from the memory blocks 102A-N available for writing data to, and the method operations can end.

If, in operation 705, the read data is in error on less than all of the wordlines WL0-WLnMax then the method operations continue in an operation 710. In operation 710, the type and scope of the read errors is identified. The wordlines WL0-WLnMax that allow accurate writing and reading of the data can be identified to the memory controller 110, in an operation 715, and the method operations can end. The memory controller 110 can include settings such as a threshold number of failed wordlines for a memory block before the selected memory block is retired. The memory controller 110 can also include logic for identifying the usable wordlines still available in the selected memory block so that the nonusable wordlines are no longer used in future write cycles of the selected memory block.

Figure 8:
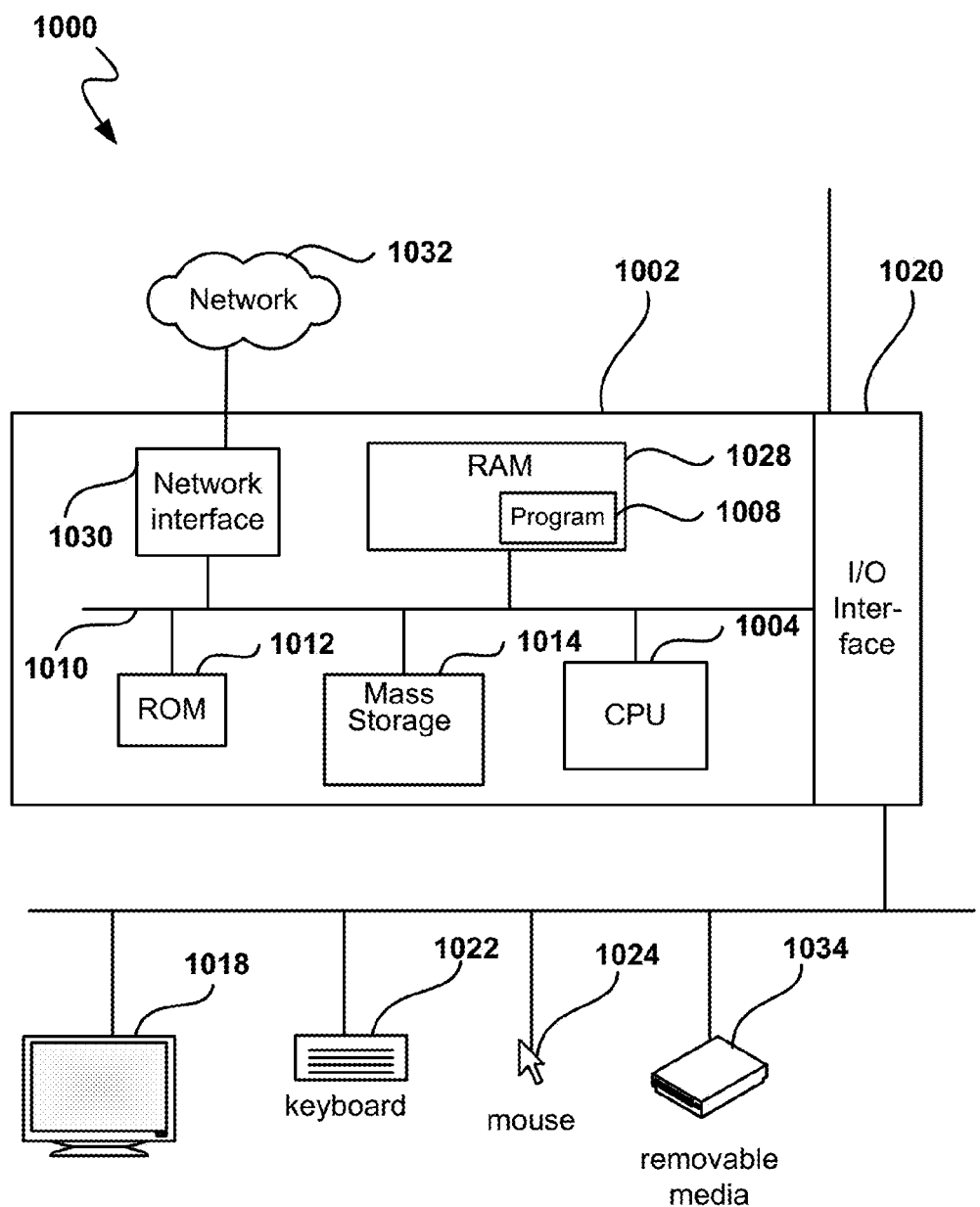
FIG. 8 is a block diagram of an example computer system for implementing embodiments of the present disclosure.

FIG. 8 is a block diagram of an example computer system 1000, for implementing embodiments of the present disclosure. A general or specialized computer system, such as the computer system 1000, can be used as the host computer system 120 as described in FIG. 1, above and used for executing the operations for performing at least a portion of the analyses described above. The computer system 1000 includes a computer 1002, a display 1018, an optional printer or output device (not shown), a removable media (e.g., magnetic/optical/flash) drive 1034, a mass storage system 1014 (e.g., hard disk drive, solid state drive, or other suitable data storage device), a network interface 1030, and a keyboard 1022. Additional user interface devices such as a mouse 1024, a touch pad or touch screen can also be included.

The computer 1002 includes a central processing unit 1004, one or more data buses 1010, random access memory (RAM) 1028, read only memory (ROM) 1012, and an input/output interface 1020. The computer 1002 can be a personal computer (such as an IBM compatible personal computer, a Macintosh computer or Macintosh compatible computer), a workstation computer (such as a Sun Microsystems or Hewlett-Packard workstation), or some other suitable type of computer.

The CPU 1004 can be a general purpose digital processor or a specially designed processor. The CPU 1004 controls the operation of the computer system 1000. Using instructions retrieved from memory (e.g. program(s) 1008), the CPU 1004 controls the reception and manipulation of input data and the output and display of data on output devices.

The data buses 1010 are used by the CPU 1004 to access the RAM 1028, the ROM 1012 and the mass storage 1014. The RAM 1028 is used by the CPU 1004 as a general storage area and as scratch-pad memory, and can also be used to store input data and processed data. The RAM 1028 and the ROM 1012 can be used to store computer readable instructions or program code 1008 readable and executable by the CPU 1004 as well as other data.

The bus 1010 can also be used to access the input, output, and storage devices used by the computer 1002. These devices include the display 1018, the optional printer (not shown), the removable media drive 1034, and the network interface 1030. The input/output interface 1020 is used to receive input from keyboard 1022 and send decoded symbols for each pressed key to CPU 1004 over the data bus 1010.

The display 1018 is an output device that displays images of data provided by the CPU 1004 via the bus 1010 or provided by other components in the computer system 1000. The optional printer device, when operating as a printer, provides an image on a sheet of paper or a similar surface. Other output devices such as a plotter, projector, etc. can be used in place of, or in addition to, the printer device.

The removable media drive 1034 and the mass storage 1014 can be used to store various types of data. The removable media drive 1034 facilitates transporting such data to other computer systems, and mass storage 1014 permits fast access to large amounts of stored data. The mass storage 1014 may be included within the computer system or may be external to the computer system such as network attached storage or cloud storage accessible over one or more networks (e.g., local area networks, wide area networks, wireless networks, Internet 1032) or combinations of such storage devices and locations.

The CPU 1004 together with an operating system operate to execute computer readable code and logic and produce and use data. The computer code, logic and data may reside within the RAM 1028, the ROM 1012, or the mass storage 1014 or other media storage devices and combinations thereof. The computer code and data could also reside on a removable program medium and loaded or installed onto the computer system 1000 when needed. Removable program media include, for example, DVD, CD-ROM, PC-CARD, floppy disk, flash memory, optical media and magnetic disk or tape.

The network interface 1030 is used to send and receive data over a network 1032 connected to other computer systems. An interface card or similar device and appropriate software implemented by the CPU 1004 can be used to connect the computer system 1000 to an existing network and transfer data according to standard protocols such as local area networks, wide area networks, wireless networks, Internet and any other suitable networks and network protocols.

The keyboard 1022 is used by a user to input commands and other instructions to the computer system 1000. Other types of user input devices can also be used in conjunction with the present invention. For example, pointing devices such as a computer mouse, a track ball, a stylus, touch pad, touch screen or a tablet can be used to manipulate a pointer on a screen of a general-purpose computer.

It will be further appreciated that the instructions represented by the operations in the above figures are not required to be performed in the order illustrated, and that all the processing represented by the operations may not be necessary to practice the invention. It should also be appreciated that some operations may have sub-operations and in other instances, certain operations described herein may not be included in the illustrated operations. Further, the processes described in any of the above figures can also be implemented in software stored in any one of or combinations of the RAM, the ROM, or the hard disk drive.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Furthermore, each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, e.g., a NOR memory array. One of skill in the art will recognize that the NAND and NOR memory configurations are exemplary, and memory elements may be otherwise configured.

The semiconductor memory elements of a single device, such as elements located within and/or over the same substrate or in a single die, may be distributed in two or three dimensions, such as a two dimensional array structure or a three dimensional array structure.

In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer over which the layers of the memory elements are deposited and/or in which memory elements are formed or it may be a carrier substrate which is attached to the memory elements after they are formed.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, such as bit lines and word lines.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate).

As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked memory planes. The columns may be arranged in a two dimensional configuration, e.g., in an x-z plane, thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single horizontal (e.g., x-z) plane. Alternatively, the memory elements may be connected together to extend through multiple horizontal planes. Other three dimensional configurations can be envisioned wherein some NAND strings contain memory elements in a single memory level while other strings contain memory elements which extend through multiple memory levels. Three dimensional memory arrays may also be designed in a NOR configuration and in a ReRAM configuration.

A monolithic three dimensional memory array is one in which multiple memory levels are formed above and/or within a single substrate, such as a semiconductor wafer. In a monolithic three dimensional array the layers of each level of the array are formed on the layers of each underlying level of the array. One of skill in the art will understand that layers of adjacent levels of a monolithic three dimensional memory array may be shared or have intervening layers between memory levels. In contrast, two dimensional arrays may be formed separately and then packaged together to form a non-monolithic memory device. For example, non-monolithic stacked memories have been constructed by forming memory levels on separate substrates and adhering the memory levels atop each other. The substrates may be thinned or removed from the memory levels before bonding, but as the memory levels are initially formed over separate substrates, such memories are not monolithic three dimensional memory arrays. Further, multiple two dimensional memory arrays or three dimensional memory arrays (monolithic or non-monolithic) may be formed separately and then packaged together to form a stacked-chip memory device.

One of skill in the art will recognize that this invention is not limited to the two dimensional and three dimensional exemplary structures described but cover all relevant memory structures within the spirit and scope of the invention as described herein and as understood by one of skill in the art.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

The invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of writing data to a memory block comprising:
   receiving user data in a memory controller, the user data to be written to the memory block;
   writing the user data to a buffer in the memory controller;
   writing a screening pattern to at least one screening column in the memory block;
   performing a first memory integrity test including:
      reading screening column data from the at least one screening column; and
      comparing the screening column data read from the at least one screening column to the screening pattern; and
   writing user data to at least one user data column in the memory block when the screening column data read from the at least one screening column matches the screening pattern in the first memory integrity test.

2. The method of claim 1, further comprising:
   performing a second memory integrity test including:
      reading the screening column data from the at least one screening column; and
      comparing the screening column data read from the at least one screening column to the screening pattern;
   performing a user data integrity test when the screening column data read from the at least one screening column matches the screening pattern in the second memory integrity test; and
   outputting a confirmation of writing the user data in the memory block.

3. The method of claim 2, wherein performing the user data integrity test includes:
   reading user column data from the at least one user data column; and
   comparing the user column data read from the at least one user data column to the user data in the buffer in the memory controller; and
   wherein outputting the confirmation of writing the user data in the memory block includes releasing the user data in the buffer in the memory controller.

4. The method of claim 1, wherein the at least one screening column includes at least one bitline in the memory block.

5. The method of claim 4, wherein the at least one screening column spans a selected portion of the wordlines in the memory block.

6. The method of claim 4, wherein the at least one screening column spans all of the wordlines in the memory block.

7. The method of claim 1, wherein the at least one screening column includes at least one wordline in the memory block.

8. The method of claim 7, wherein the at least one screening column spans a selected portion of the bitlines in the memory block.

9. The method of claim 1, wherein writing the screening pattern to the at least one screening column in the memory block includes determining if at least one of the first memory integrity test, the second memory integrity test and/or the user data integrity test is applicable to the memory block.

10. The method of claim 1, wherein the screening pattern includes a known set of data values capable of being programmed to the screening columns and capable of being accurately read back from the screening columns.

11. A method of writing data to a memory block comprising:
   receiving user data in a memory controller, the user data to be written to the memory block;
   writing the user data to a buffer in the memory controller;
   writing a screening pattern to at least one screening column in the memory block;
   performing a first memory integrity test;
   writing user data to at least one user data column in the memory block when the screening column data read from the at least one screening column matches the screening pattern in the first memory integrity test;
   performing a second memory integrity test;
   performing a user data integrity test when the screening column data read from the at least one screening column matches the screening pattern in the second memory integrity test;
   outputting a confirmation of writing the user data in the memory block; and
   releasing the user data from the buffer in the memory controller.

12. A memory system comprising:
   at least one memory block;
   a memory controller coupled to the at least one memory block;
   a screening pattern capable of being written to the at least one memory block; and
   a memory verification logic including:
      computer readable instructions on computer readable media for performing a first memory integrity test; and
      computer readable instructions on computer readable media for writing user data to at least one user data column in the memory block when a screening column data read from at least one screening column in the memory block matches the screening pattern in the first memory integrity test.

13. The system of claim 12, wherein the memory verification logic further includes:
- computer readable instructions on computer readable media for performing a second memory integrity test;
- computer readable instructions on computer readable media for performing a user data integrity test when the screening column data read from the at least one screening column matches the screening pattern in the second memory integrity test;
- computer readable instructions on computer readable media for outputting a confirmation of writing the user data in the memory block; and
- computer readable instructions on computer readable media for releasing the user data from the buffer in the memory controller.

14. The system of claim 12, at least one of the memory verification logic and/or the screening pattern is included in the memory controller.

15. The system of claim 12, wherein at least one of the memory verification logic and/or the screening pattern is included in a logic control circuit in a memory integrated circuit including at least one of the at least one memory block.

16. The system of claim 12, wherein the at least one memory block includes at least one screening column and at least one user data column.

17. The system of claim 16, wherein the at least one screening column includes a width of between about 1 bit and about 128 bits.

18. The system of claim 16, wherein the at least one screening column includes at least two non-contiguous screening columns.

19. The system of claim 16, wherein the at least one screening column includes at least one bitline.

20. The system of claim 12, wherein the screening pattern includes a known set of data values capable of being programmed to the screening columns and capable of being accurately read back from the screening columns.

* * * * *